United States Patent
Wang et al.

(10) Patent No.: US 11,685,695 B2
(45) Date of Patent: Jun. 27, 2023

(54) ALUMINUM NITRIDE-BASED SINTERED COMPACT AND SEMICONDUCTOR HOLDING DEVICE

(71) Applicant: KYOCERA Corporation, Kyoto (JP)

(72) Inventors: Yucong Wang, Kirishima (JP); Masahiro Satou, Kirishima (JP); Kazuhiro Kuchimachi, Kirishima (JP)

(73) Assignee: KYOCERA Corporation, Kyoto (JP)

( * ) Notice: Subject to any disclaimer, the term of this patent is extended or adjusted under 35 U.S.C. 154(b) by 727 days.

(21) Appl. No.: 16/615,041

(22) PCT Filed: May 29, 2018

(86) PCT No.: PCT/JP2018/020519
§ 371 (c)(1),
(2) Date: Nov. 19, 2019

(87) PCT Pub. No.: WO2018/221504
PCT Pub. Date: Dec. 6, 2018

(65) Prior Publication Data
US 2020/0207666 A1 Jul. 2, 2020

(30) Foreign Application Priority Data

May 30, 2017 (JP) .............................. JP2017-106706

(51) Int. Cl.
*C04B 35/581* (2006.01)
*H01L 21/683* (2006.01)

(52) U.S. Cl.
CPC ........ *C04B 35/581* (2013.01); *H01L 21/6833* (2013.01); *C04B 2235/3222* (2013.01);
(Continued)

(58) Field of Classification Search
CPC .......... C04B 35/581; C04B 2235/3222; C04B 2235/3865; C04B 2235/3869; C04B 2235/87; C04B 2235/9669; H01L 21/6833
See application file for complete search history.

(56) References Cited

U.S. PATENT DOCUMENTS

2006/0217259 A1* 9/2006 Teratani ................. C04B 35/645
501/98.5
2014/0079946 A1* 3/2014 Jindo .................. H01L 21/6833
156/276

FOREIGN PATENT DOCUMENTS

CN 102933520 A 2/2013
EP 0548424 A1 6/1993
(Continued)

OTHER PUBLICATIONS

JP04118883A machine translation (Year: 1992).*

*Primary Examiner* — Karl E Group
*Assistant Examiner* — Cameron K Miller
(74) *Attorney, Agent, or Firm* — Volpe Koenig

(57) ABSTRACT

An aluminum nitride-based sintered compact includes: aluminum nitride crystal particles containing Mg; composite oxide containing a rare earth element and Al, the composite oxide having a garnet crystal structure; and composite oxynitride containing Mg and Al. Particles of the composite oxide and particles of the composite oxynitride are interspersed between the aluminum nitride crystal particles. The composite oxide may include Y. A content of Mg in the aluminum nitride crystal particles may fall in a range of 0.1 mol % or more and 1.0 mol % or less, based on a total of all metal elements contained in the aluminum nitride crystal particles taken as 100 mol %. A semiconductor holding
(Continued)

device includes the aluminum nitride-based sintered compact; and an electrostatic adsorptive electrode.

4 Claims, 2 Drawing Sheets

(52) U.S. Cl.
CPC ............... *C04B 2235/3865* (2013.01); *C04B 2235/3869* (2013.01); *C04B 2235/87* (2013.01); *C04B 2235/9669* (2013.01)

(56) References Cited

FOREIGN PATENT DOCUMENTS

| | | | |
|---|---|---|---|
| EP | 2581357 A1 | 4/2013 | |
| JP | 04-118883 A | 4/1992 | |
| JP | 04118883 A * | 4/1992 | ........... C04B 35/581 |
| JP | 09-263452 A | 10/1997 | |
| JP | 2002-220282 A | 8/2002 | |
| JP | 2014-058418 A | 4/2014 | |
| KR | 10-2006-0103146 A | 9/2006 | |
| KR | 10-2013-0087481 A | 8/2013 | |
| WO | 2012/056807 A1 | 5/2012 | |

* cited by examiner

US 11,685,695 B2

ALUMINUM NITRIDE-BASED SINTERED COMPACT AND SEMICONDUCTOR HOLDING DEVICE

CROSS-REFERENCE TO RELATED APPLICATIONS

This application is a national stage entry according to 35 U.S.C. 371 of International Application No. PCT/JP2018/020519 filed on May 29, 2018, which claims priority to Japanese Patent Application No. 2017-106706 filed on May 30, 2017, the contents of which are entirely incorporated herein by reference.

TECHNICAL FIELD

The present disclosure relates to an aluminum nitride-based sintered compact and a semiconductor holding device.

BACKGROUND

Semiconductor manufacturing equipment used for a dry process (film formation, cleaning, dry etching, etc.) in semiconductor manufacturing operation utilizes highly reactive halogen plasma such as F plasma or Cl plasma for film-forming purposes, etching purposes, or cleaning purposes. Aluminum nitride-based sintered compact is used as the material of construction of a component for holding a semiconductor wafer, such for example as a heater or an electrostatic chuck, which is used in semiconductor manufacturing equipment of this type. Aluminum nitride-based sintered compact exhibits high mechanical strength, high resistance to thermal shock, high volume resistivity, high thermal conductivity, and high resistance to corrosion by halogen gas. Aluminum nitride-based sintered compact which is highly resistant to corrosion by halogen gas has high resistance to corrosion by halogen plasma correspondingly. In the following description, resistance to corrosion by plasma may be expressed as plasma resistance.

What are required of semiconductor integrated circuits now are an ever-finer circuit pattern and ever-denser packaging. As an attempt to achieve an ever-finer pattern and ever-denser packaging for a semiconductor integrated circuit, a semiconductor wafer, etc. have been worked on at high temperatures, for example, at a temperature of 600° C. or higher. Unfortunately, ordinary aluminum nitride-based sintered compact undergoes a decrease in electrical resistivity to $10^6$ Ω·m or below at such a high temperature, causing difficulties in keeping insulation properties.

As aluminum nitride-based sintered compact that exhibits excellent insulation performance in a high-temperature region, there is known aluminum nitride-based sintered compact with magnesium or a magnesium-containing compound added. For example, Japanese Unexamined Patent Publication JP-A 4-118883 (1992) (Patent Literature 1) discloses, as an insulator for spark plug, aluminum nitride-based ceramic sintered compact having magnesium-containing grain boundary phase, which exhibits high insulation resistance at a temperature of 700° C. Japanese Unexamined Patent Publication JP-A 2002-220282 (Patent Literature 2) discloses, as aluminum nitride-based sintered compact that exhibits high volume resistivity at a temperature of 800° C., aluminum nitride-based sintered compact containing aluminum nitride, a rare earth compound, and $MgAl_2O_4$.

SUMMARY

An aluminum nitride-based sintered compact according to the disclosure includes: aluminum nitride crystal particles containing Mg; composite oxide containing a rare earth element and Al, the composite oxide having a garnet crystal structure; and composite oxynitride containing Mg and Al, and the composite oxide and the composite oxynitride are interspersed as particles between the aluminum nitride crystal particles.

A semiconductor holding device according to the disclosure includes: an aluminum nitride-based sintered compact; and an electrostatic adsorptive electrode, and the aluminum nitride-based sintered compact comprises the above-described aluminum nitride-based sintered compact.

DETAILED DESCRIPTION

Figure 1:
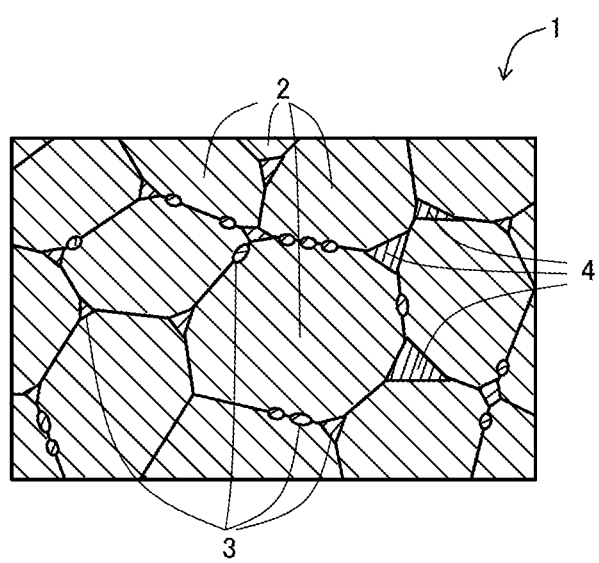
FIG. 1 is a sectional view schematically showing the structure of an embodiment of the aluminum nitride-based sintered compact.

As shown in FIG. 1, an aluminum nitride-based sintered compact 1 according to the embodiment includes aluminum nitride crystal particles 2 containing Mg, composite oxide containing a rare earth element and Al, and composite oxynitride containing Mg and Al. The composite oxide and composite oxynitride in particulate form, that is; composite oxide particles 3 and composite oxynitride particles 4, are interspersed between the aluminum nitride crystal particles 2. As used herein the particulate form refers to a particle having an aspect length-to-width ratio of less than or equal to 5, wherein the length corresponds to the maximum length in section and the width corresponds to the minimum length, or thickness in section.

Aluminum nitride crystal contains Al and N in a ratio of 1:1 and forms a crystalline lattice. When oxygen (O) goes into solid solution in the aluminum nitride crystal, Al vacancies are created due to Al and O being present in a ratio of 2:3 in a condition of stability. The Al vacancies become electrically conductive carriers at high temperatures, and thus, aluminum nitride-based sintered compact containing aluminum nitride crystal with oxygen in solid solution undergoes a decrease in electrical resistivity at high temperatures. In what follows, volume resistivity may be used in place of electrical resistivity for the sake of explanation.

The aluminum nitride-based sintered compact 1 according to the embodiment contains a rare earth element. In this case, part of oxygen present in solid solution in the aluminum nitride crystal particle 2 reacts with the rare earth element, with consequent reduction in the amount of oxygen present in solid solution in the aluminum nitride crystal particle 2. The higher the content of the rare earth element in the aluminum nitride-based sintered compact 1, the smaller the amount of oxygen present in solid solution in the aluminum nitride crystal particle 2.

Moreover, the aluminum nitride crystal particle 2 contains Mg, expressed differently, Mg is present in solid solution in the aluminum nitride crystal particle 2. In this case, oxygen present in solid solution in the aluminum nitride crystal particle 2 binds with Mg. This makes it possible to reduce formation of Al vacancies in the aluminum nitride crystal particle 2, and thereby maintain the insulation resistance at a high level even under high-temperature conditions. In the following description, aluminum nitride may be expressed simply as AlN. For example, the aluminum nitride-based sintered compact 1 may be expressed simply as the AlN-based sintered compact 1, and the aluminum nitride crystal particle 2 may be expressed simply as the AlN particle 2.

Moreover, in the embodiment, the composite oxide particle 3 containing a rare earth element and Al has a garnet crystal structure. Composite oxide of the rare earth element and Al forms various crystal structures depending on the ratio between the rare earth element (R) and Al, including the garnet crystal structure ($R_3Al_5O_{12}$), a perovskite crystal structure ($RAlO_3$), and a melilite crystal structure ($R_4Al_2O_9$). Composite oxide having the garnet crystal structure, in particular, exhibits high insulation resistance at high temperatures. Thus, when the particle 3 contained in the aluminum nitride-based sintered compact 1, that is, composite oxide of the rare earth element and aluminum has the garnet crystal structure, the aluminum nitride-based sintered compact 1 according to the embodiment exhibits higher volume resistivity at high temperatures. In the following description, composite oxide of the rare earth element and Al may be expressed simply as composite oxide, and the composite oxide particle 3 containing a rare earth element and Al may be expressed simply as the composite oxide particle 3.

The aluminum nitride-based sintered compact 1 may be substantially free of composite oxide having other crystal structure than the garnet crystal structure. In other words, in the aluminum nitride-based sintered compact 1 according to the embodiment, the crystalline phase of composite oxide having other crystal structure than the garnet crystal structure need not necessarily be detected by X-ray diffraction (XRD) measurement.

The AlN-based sintered compact 1 according to the embodiment further contains the composite oxynitride particles 4 containing Mg and Al. Mg—Al composite oxynitride (MgAlON) is higher in plasma resistance than Mg-containing oxide such as $MgAl_2O_4$ and MgO. The presence of such a composite oxynitride between the aluminum nitride crystal particles 2 enhances the plasma resistance of the AlN-based sintered compact 1.

Moreover, as compared to Mg-containing oxide such as $MgAl_2O_4$ and MgO, Mg—Al composite oxynitride (MgAlON) differs only slightly from AlN in thermal expansion coefficient. Thus, as contrasted to the presence of $MgAl_2O_4$ and MgO between the AlN crystal particles 2, as is the case with the embodiment, the presence of Mg—Al composite oxynitride (MgAlON) between the AlN crystal particles 2 reduces the residual stress in the vicinity of the grain boundary of the AlN crystal particles 2, with consequent enhancement in the plasma resistance of the AlN-based sintered compact 1. That is, in the embodiment, the presence of the composite oxynitride particles 4 containing Mg and Al between the aluminum nitride crystal particles 2 makes it possible to maintain the plasma resistance of the aluminum nitride-based sintered compact 1 at a high level. In the following description, the composite oxynitride particles 4 containing Mg and Al may be expressed simply as the composite oxynitride particles 4.

In the embodiment, the composite oxide particles 3 and the composite oxynitride particles 4 are interspersed between the AlN particles 2. That is, in the section of the aluminum nitride-based sintered compact 1, the composite oxide particles 3 and the composite oxynitride particles 4 do not exist in the form of a continuous grain boundary layer covering the surface of the AlN particle 2 but exist in the form of separate particles at grain-boundary triple junction or interfacial grain boundary between the AlN particles 2. In other words, the AlN particle 2 has a portion kept in direct contact with adjacent AlN particles 2 without intermediary of other phase (grain boundary layer of composite oxide crystal, composite oxynitride, etc.), and this portion makes up a predetermined proportion, for example, 30% or greater, of the AlN particle 2. For example, in the section of the AlN-based sintered compact 1, the proportion of that part of the AlN particle 2 which makes direct contact with other AlN particles 2 may be determined as the average proportion of the edge of the AlN particle 2 which makes direct contact with the edges of other AlN particles 2.

While AlN exhibits high thermal conductivity, the thermal conductivity of the AlN-based sintered compact 1 is dependent on the crystal structure of the AlN particle 2 and the structure of the sintered compact. For example, a decrease in thermal conductivity in the AlN-based sintered compact 1 is caused by irregularity in crystal structure resulting from the presence of other element such as oxygen in solid solution in the AlN particle 2, or by interposition of a grain boundary layer having low thermal conductivity between the AlN particles 2.

Improvement in characteristics other than thermal conductivity, for example, improvement in the insulation performance of the AlN particle 2 under high-temperature conditions, may be achieved by letting Mg go into solid solution in the AlN particle 2 during firing of the AlN-based sintered compact 1 or by addition of a rare earth element to reduce the amount of oxygen present in solid solution in the AlN particle 2. In such an attempt, however, an excess of the added component may form grain boundary phase so as to cover the surface of the AlN particle 2, causing deterioration in thermal conduction between adjacent AlN particles 2. In this regard, in the embodiment, composite oxide and composite oxynitride, which have not been in solid solution with the AlN particle 2, do not exist in the form of a continuous grain boundary layer covering the surface of the AlN particle 2, but exist in the form of interspersed composite oxide particles 3 and composite oxynitride particles 4 at grain-boundary triple junction or interfacial grain boundary between the AlN particles 2. This enables adjacent AlN particles 2 to be partly kept in direct contact with each other, with consequent keeping of high thermal conductivity of the AlN-based sintered compact 1.

Moreover, for example, even if the composite oxide or the composite oxynitride exhibits low volume resistivity, with such an interspersed arrangement of the composite oxide particles 3 and the composite oxynitride particles 4, expressed differently, as long as the composite oxide and the composite oxynitride do not exist in the form of a continuous layer but exist in the form of spaced-apart individual particles at grain boundary of the AlN particles 2, the volume resistivity of the AlN-based sintered compact 1 can be maintained at a high level.

For example, an average particle size of the AlN particles 2 may be 10 μm or less. Alternatively, the average particle size of the AlN particles 2 may fall in the range of 1 μm or more and 10 μm or less, or in the range of 3 μm or more and 8 μm or less. Where the average particle size of the AlN particles 2 is as small as 10 μm or less, the number of grain boundary regions in the AlN-based sintered compact 1 increases, in consequence whereof there results scattering of the composite oxide and composite oxynitride in particulate form over an increased number of grain boundary regions.

This enables the composite oxide particles 3 and the composite oxynitride particles 4 to be interspersed at grain boundary between the AlN particles 2. Moreover, an average particle size of the composite oxide particles 3, as well as the composite oxynitride particles 4 may be 3 μm or less. Where each of the average particle size of the AlN particles 2, the average particle size of the composite oxide particles 3, and the average particle size of the composite oxynitride particles 4 falls in the corresponding prescribed range, the thermal conductivity and the volume resistivity of the AlN-based sintered compact 1 can be maintained at a high level.

The following is an example of means for identifying the interspersed arrangement of the composite oxide particles 3 and the composite oxynitride particles 4 between the AlN particles 2. The fracture surface or mirror-finished surface of the section of the AlN-based sintered compact 1 is examined by texture observation using an element analyzer-equipped microscope such as a scanning electron microscope (SEM), a scanning transmission electron microscope (STEM), or a transmission electron microscope (TEM) to check the presence of particles and grain boundary layers. Moreover, the microscopically observed particles and grain boundary layers are subjected to element analysis to determine the constituent components thereof.

For example, given that the total of all metal elements contained in the AlN particle 2 is taken as 100 mol %, the content of Mg in the AlN particle 2, or equivalently, the amount of Mg present in solid solution in the AlN particle 2 may fall in the range of 0.1 mol % to 1.0 mol %, or particularly in the range of 0.3 mol % to 0.6 mol %. Where the content of Mg in the AlN particle 2 is greater than or equal to 0.1 mol %, the resistivity of the AlN particle 2 can be increased. Where the content of Mg in the AlN particle 2 is less than or equal to 1.0 mol %, the thermal conductivity of the AlN particle 2 can be maintained at a high level. The content of Mg in the AlN particle 2 is determined by examination of the fracture surface or mirror-finished surface of the section of the AlN-based sintered compact 1 through local element analysis such as wavelength dispersive X-ray spectrometry (WDS), energy dispersive X-ray spectrometry (EDS), or secondary ion mass spectrometry (SIMS) for the AlN particle 2.

The rare earth element used to form the composite oxide particle 3 is not limited to a particular element. Examples of the rare earth element include Y, La, Ce, Ho, Gd, Nd, Sm, Dy, Yb, Er, and Lu. Y (yttrium), in particular, is suitable for use. Y is capable of forming, in conjunction with Al, a garnet crystal structure, and is conducive to efficient reduction of the amount of oxygen present in solid solution in AlN crystal. Moreover, Y—Al composite oxide having a garnet crystal structure ($Y_3Al_5O_{12}$, also known as YAG) exhibits high volume resistivity compared to garnet-type oxide of a composite of Al and other rare earth element than Y. The presence of the composite oxide 3 of garnet structure in the AlN-based sintered compact 1 can be checked by X-ray diffraction (XRD) measurement of the AlN-based sintered compact 1.

The thermal conductivity and the plasma resistance of the AlN-based sintered compact 1 are highly dependent on the denseness of the AlN-based sintered compact 1. In the interests of high thermal conductivity and high plasma resistance, the AlN-based sintered compact 1 may be made to have an open porosity of 0.2% or less.

The aluminum nitride-based sintered compact 1 according to the embodiment may be produced in the following manner. As raw materials, for example, there are prepared: aluminum nitride powder having a purity of 99% or greater, an average particle size of 0.5 μm to 1.0 μm, and an oxygen content of 1.2% by mass or less; a powdery rare earth compound having a purity of 99% or greater, an average particle size of 0.5 μm to 1.2 μm, and a specific surface area according to BET in the range of 3 $m^2/g$ to 10 $m^2/g$; and a powdery compound containing magnesium (Mg) having a purity of 99% or greater and an average particle size of 0.5 μm to 1.2 μm, for example, magnesium hydroxide ($Mg(OH)_2$) powder, magnesium carbonate ($MgCO_3$) powder, or magnesium oxide (MgO) powder. In the following description, the aluminum nitride powder may be expressed as the AlN powder, and the compound containing magnesium (Mg) may be expressed as the Mg-containing compound.

0.08 to 1.2 mol % of the powdery rare earth compound, on an oxide basis ($R_2O_3$, wherein R represents a rare earth element), and 0.3 to 4.0 mol % of the Mg-containing compound, on an oxide basis (MgO), are admixed in 100 mol % of the AlN powder to form a powder mixture. In the following description, the amount of addition of an additive is represented in oxide terms unless otherwise specified. An organic binder is suitably added to the obtained powder mixture to form a molded body of predetermined shape.

The obtained molded body is fired in an atmosphere of nitrogen at a predetermined maximum temperature with a predetermined firing profile. In this way, the AlN-based sintered compact according to the embodiment is obtained.

Where the powdery rare earth compound is added in an amount of 0.08 mol % or greater, on an oxide basis, based on 100 mol % of the AlN powder, oxygen contained in the AlN particle 2 can be reduced, with consequent increase in resistivity in the AlN particle 2. Where the powdery rare earth compound is added in an amount of less than or equal to 1.2 mol % on an oxide basis, a garnet crystal structure can be formed readily by a rare earth element and Al, with consequent reduction in the formation of other crystal structure that exhibits low resistivity and low thermal conductivity at high temperatures, such as a perovskite crystal structure ($RAlO_3$) and a melilite crystal structure ($R_4Al_2O_9$). The fulfillment of such conditions allows improvement in volume resistivity and thermal conductivity in the AlN-based sintered compact 1. The amount of addition of the powdery rare earth oxide may particularly fall in the range of 0.15 mol % to 0.45 mol %. As the rare earth compound added to the AlN powder, in addition to the described oxide powder, it is possible to use organic salts, inorganic salts, and solutions of such compounds.

Where the powdery Mg-containing compound is added in an amount of 0.3 mol % or greater, on an oxide basis, based on 100 mol % of the AlN powder, Al vacancies present in the AlN particle 2 can be reduced. Where the powdery Mg-containing compound is added in an amount of 4.0 mol % or less on an oxide basis, it is possible to restrain Mg from going into solid solution excessively in the AlN particle 2, and thereby maintain the thermal conductivity of the AlN particle 2. The amount of addition of the powdery Mg-containing compound may particularly fall in the range of 0.5 mol % to 1.7 mol %. As the Mg-containing compound added to the AlN powder, in addition to magnesium oxide, magnesium hydroxide, and magnesium carbonate, it is possible to use organic salts, inorganic salts, and solutions of such compounds. Magnesium hydroxide, in particular, undergoes decomposition by heating, and the resultant powder exhibits high surface activity. Thus, when using magnesium hydroxide as the Mg-containing compound, Mg goes into solid solution readily in the AlN particle 2.

The addition of 1.0 mol % of the rare earth compound, on an oxide basis, to 100 mol % of the AlN powder means the addition of 1.0 mol % of a $R_2O_3$-equivalent rare earth compound to 100 mol % of AlN. Moreover, the addition of 1.0 mol % of the Mg-containing compound, on an oxide basis, to 100 mol % of the AlN powder means the addition of 1.0 mol % of a MgO-equivalent Mg-containing compound to 100 mol % of AlN.

Where the amount of oxygen contained in the AlN powder is 1.2% by mass or less, the AlN-based sintered compact 1 having high volume resistivity and high thermal conductivity can be obtained with efficiency.

The raw materials are mixed by heretofore known means, for example, a rotary ball mill, a vibratory ball mill, a bead mill, or a high-speed stirrer. The resultant mixture is molded by heretofore known molding means. Specific examples of the molding means include die pressing, cold isostatic pressing, sheet-forming technique such as doctor blade method or rolling, and extrusion molding.

The resultant molded body is fired under the following predetermined conditions. The predetermined conditions involves the rate of temperature rise in a temperature-raising process of increasing the temperature from 1500° C. to the maximum temperature, the time for retention at the maximum temperature, and the rate of temperature fall in a cooling process of lowering the temperature from the maximum temperature to 1400° C.

In the temperature-raising process of increasing the temperature from 1500° C. to the maximum temperature, the temperature is raised at rates ranging from 0.5° C./min to 5.0° C./min. Raising the temperature at the rate of less than or equal to 5.0° C./min makes it possible to take time for a rare earth element to react with oxygen present in AlN, as well as time for Mg to spread within the AlN particle 2, in the temperature-raising process. Moreover, in the temperature-raising process, AlN and MgO react with each other in the vicinity of the surface of the AlN particle 2 to form a solid solution. The solid solution forms MgAlON in the subsequent retention process at the maximum temperature. Raising the temperature at the rate of 0.5° C./min or greater makes it possible to reduce grain growth of the AlN particles 2, and thereby obtain a denser AlN-based sintered compact 1. The phases of other compounds than AlN formed on the surface of the AlN particle 2 in the temperature-raising process are collectively called grain boundary phase.

The maximum temperature for the firing process falls in the range of 1700° C. to 1900° C. Where the maximum temperature is 1700° C. or higher, the above-described various reactions proceed adequately with progressive densification. Where the maximum temperature is 1900° C. or lower, the grain growth of the AlN particles 2 can be reduced. From the standpoint of the progression of densification and grain growth reduction, the maximum temperature set for the firing process may alternatively fall in the range of 1750° C. to 1850° C. The time for retention at the maximum temperature may be changed on an as needed basis in accordance with the average particle size and specific surface area of each raw material, the filling factor for the molded body, and the size of the molded body.

In the cooling process of lowering the temperature from the maximum temperature to 1400° C., the temperature is lowered at rates ranging from 0.3° C./min to 5.0° C./min. In the cooling process, a change of surface tension occurs between the AlN particle 2 and the grain boundary phase with decreasing temperature. Lowering the temperature at the rate of 0.3° C./min or greater makes it possible to reduce grain growth of the AlN particles 2, and thereby obtain a denser AlN-based sintered compact 1. Lowering the temperature at the rate of less than or equal to 5.0° C./min makes it possible to take time for the grain boundary phase to move in response to the change of surface tension between the AlN particle 2 and the grain boundary phase. As a result, the grain boundary phase moves from the interfacial grain boundary so as to collect in the grain-boundary triple junction, or localized grain boundary phase agglomeration occurs at the interfacial grain boundary, with consequent formation of particles. Thus, there is obtained the AlN-based sintered compact 1 in which the composite oxide particles 3 and the composite oxynitride particles 4 are interspersed between the AlN particles 2. In such an AlN-based sintered compact 1, the AlN particles 2 are partly kept in direct contact with each other at the grain boundaries. This enables the AlN-based sintered compact 1 to have high thermal conductivity and high volume resistivity.

Lowering the temperature at the rate of greater than 5.0° C./min in the cooling process makes it difficult to take time required for the movement of the grain boundary phase. Consequently, the grain boundary phase may cover the surface of the AlN particle 2, causing deterioration in thermal conduction between adjacent AlN particles 2.

Instead of exercising control of the rate of temperature rise in the temperature-raising process and control of the rate of temperature fall in the cooling process as described above, for example, the step of carrying out retention at a specific temperature in the temperature range set for the temperature-raising process for a predetermined period of time, and the step of carrying out retention at a specific temperature in the temperature range set for the cooling process for a predetermined period of time may be additionally included in the firing process.

In the AlN-based sintered compact 1 according to the embodiment, in addition to the described Al, Mg, and rare earth element (R), other metal elements such as Si, Ca, Ti, Mn, Ni, Mo, and W may be contained in an amount of 0.5% by mass or less. The addition of such metal elements allows enhancement in sinterability and bondability with electrodes without causing deterioration in the desired performance capability.

Figure 2:
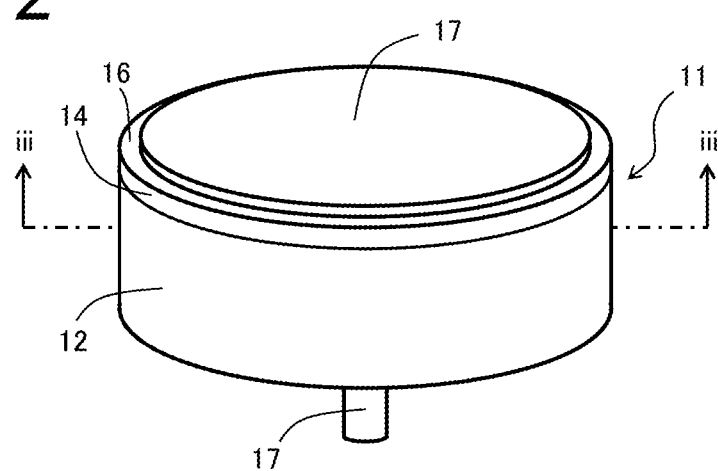
FIG. 2 is a perspective view showing an example of an electrostatic chuck.
Figure 3:
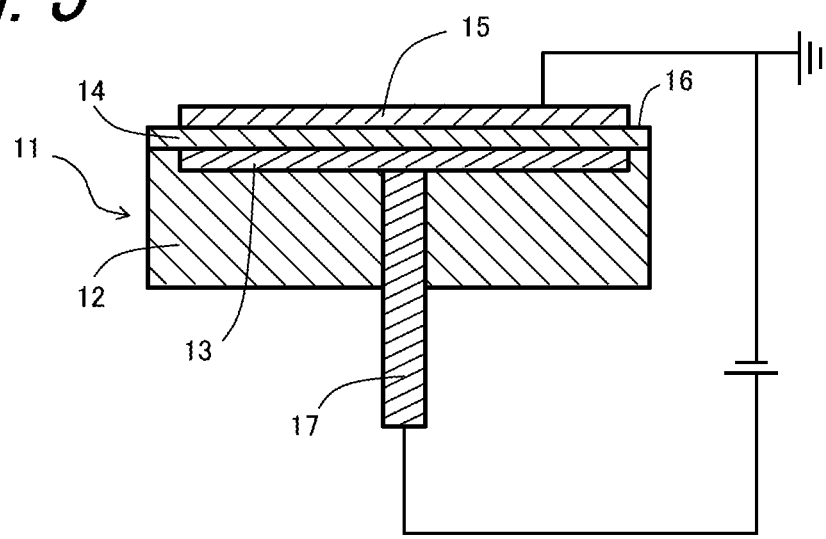
FIG. 3 is a sectional view taken along the line iii-iii of FIG. 2.

FIG. 2 is a perspective view showing an example of an electrostatic chuck which serves as a semiconductor holding device. FIG. 3 is a sectional view taken along the line iii-iii of FIG. 2. As shown in FIG. 3, the electrostatic chuck 11 includes an electrostatic adsorptive electrode 13 located on a surface of an insulating ceramic base 12. The surface of the ceramic base 12 is provided with a dielectric layer 14 for covering the electrostatic adsorptive electrode 13. An upper face of the dielectric layer 14 serves as an attractive face 16 that attracts an object to be held 15 such as a Si wafer. The face of the electrostatic chuck 11 which is opposite to the attractive face 16 is provided with a feeding terminal 17 electrically connected to the electrostatic adsorptive electrode 13.

The dielectric layer 14 is produced with use of the aluminum nitride-based sintered compact 1 according to the embodiment that excels in mechanical strength and resistance to thermal shock, and exhibits high volume resistivity, high thermal conductivity, and high resistance to corrosion by halogen gas.

The ceramic base 12 is made of insulating ceramics such as alumina, silicon nitride, or aluminum nitride. When using the aluminum nitride-based sintered compact 1, in particular, for the ceramic base 12, a firing step of forming the ceramic base 12 can be performed concurrently with the firing of the aluminum nitride-based sintered compact 1 used for the dielectric layer 14. Moreover, where the ceramic base 12 is made of the aluminum nitride-based sintered compact 1 just as with the dielectric layer 14, the difference in thermal expansion coefficient between the ceramic base 12 and the dielectric layer 14 is so small that deformation such as warpage or distortion is less likely to occur during the firing process. This makes it possible to obtain a highly reliable electrostatic chuck 11.

The electrostatic adsorptive electrode 13 and the feeding terminal 17 are each made of a refractory metal such as tungsten, molybdenum, or platinum. Such a refractory metal is similar in thermal expansion coefficient to the aluminum nitride-based sintered compact 1 constituting the ceramic base 12. Thus, the use of the refractory metal for the electrostatic adsorptive electrode 13 and the feeding terminal 17 allows enhancement in adherability between the ceramic base 12 and each of the electrostatic adsorptive electrode 13 and the feeding terminal 17 during firing and heating operation. Note that the feeding terminal 17 may be made of an iron-cobalt-chromium alloy considering that it may be exposed to corrosive gas.

Although the electrostatic chuck 11 is illustrated as being internally provided with the electrostatic adsorptive electrode 13 alone in FIGS. 2 and 3, in addition to the electrostatic adsorptive electrode 13, for example, a heater electrode may be embedded in the electrostatic chuck 11. The burial of the heater electrode makes it possible to configure the electrostatic chuck 11 for direct heat production, and thereby reduce heat loss considerably as contrasted to the case of adopting an indirect heating system.

Figure 4:
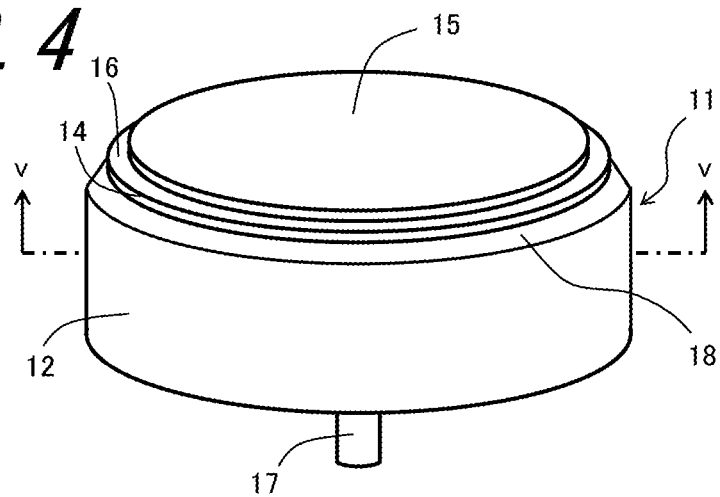
FIG. 4 is a perspective view showing another example of the electrostatic chuck.
Figure 5:
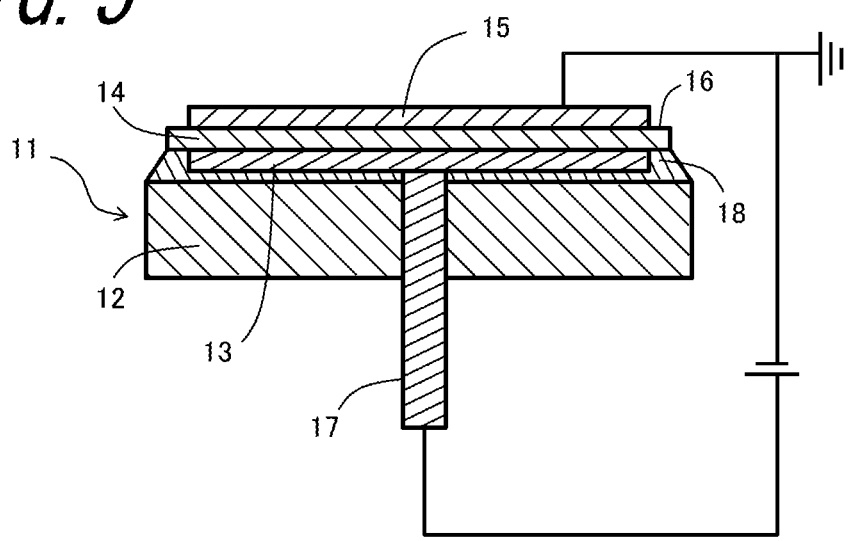
FIG. 5 is a sectional view taken along the line v-v of FIG. 4.

FIG. 4 is a perspective view showing another example of an electrostatic chuck which serves as a semiconductor holding device, and FIG. 5 is a sectional view taken along the line v-v of FIG. 4. The electrostatic chuck 11 includes an insulating base 12 and a disk-shaped dielectric plate 14 formed of the aluminum nitride-based sintered compact 1 according to the embodiment. An electrostatic adsorptive electrode 13 is formed on the lower face of the dielectric plate 14. The insulating base 12 and the dielectric plate 14 are joined to each other via a joining material 18 such as glass, a brazing material, or an adhesive. The electrostatic adsorptive electrode 13 is embedded in between the insulating base 12 and the dielectric plate 14. The upper face of the dielectric plate 12 serves as an attractive face 16 that attracts an object to be held 15 such as a Si wafer. The face of the electrostatic chuck 11 which is opposite to the attractive face 16 is provided with a feeding terminal 17 electrically connected to the electrostatic adsorptive electrode 13.

The insulating base 12 is made of an insulating material, for example, ceramics such as sapphire, alumina, silicon nitride, and aluminum nitride. Examples of the material for constituting the electrostatic adsorptive electrode 13 include metals such as copper and titanium, and TiN, TaN, and WC. The electrostatic adsorptive electrode 13 is formed on the lower face of the dielectric plate 14 by means of vapor deposition, metallization, plating, PVD, CD, or otherwise.

The electrostatic chuck 11 can be produced simply by joining together the separately prepared dielectric plate 14 and insulating base 12 via the joining material 18.

Although the electrostatic chuck 11 is, as exemplified, a unipolar electrostatic chuck, it may be built as a bipolar electrostatic chuck.

The base 12 of the semiconductor holding device as shown in FIGS. 2, 3, 4, and 5 may be internally provided with a flow channel for passing a heat medium. The heat medium passing through the flow channel formed inside the base 12 helps facilitate temperature control of the to-be-held object 15 which is held to the attractive face 16.

Examples

As raw materials, aluminum nitride powder having a purity of 99%, an average particle size of 0.7 μm, and an oxygen content of 1.0% by mass was blended with various powdery rare earth oxide materials each having a purity of 99% or greater and a specific surface area (BET) of 7 m²/g or greater and magnesium hydroxide ($Mg(OH)_2$) powder having a purity of 99.5% and an average particle size of 5 μm in prescribed proportions as shown in Table 1. As a solvent, isopropyl alcohol (IPA) was admixed in the blend of the raw materials in a ball mill, and, the resultant admixture has been dried into a powder mixture.

As a binder, paraffin wax was added in an amount of 8 parts by mass based on 100 parts by mass of the obtained powder mixture. The resultant admixture was press-molded under a pressure of 100 MPa and further subjected to isostatic compression under a hydrostatic pressure of 300 MPa to form a disk-shaped molded body which is 60 mm in diameter and 4 mm in thickness.

The thereby formed molded body was heat-treated in a vacuum to remove the binder. The binder-free molded body was placed in an aluminum nitride-made container designed for firing, and was fired at normal pressures in an atmosphere of nitrogen under firing conditions shown in Table 1, involving the rate of temperature rise, retention temperature and retention time, and the rate of temperature fall. In this way, an aluminum nitride (AlN)-based sintered compact was obtained.

The open porosity of the obtained AlN-based sintered compact was calculated by density measurement in accordance with Archimedes' law. The data of the open porosity of each AlN-based sintered compact is shown in Table 2.

The structure of the obtained AlN-based sintered compact was analyzed with a scanning electron microscope (SEM) and wavelength dispersive X-ray spectrometry (WDS). To determine the content of Mg in the AlN particle, the mirror-finished surface of the section of the aluminum nitride-based sintered compact was observed under SEM to identify AlN particles, and, element analysis was performed on the central area of the microscopically observed AlN particle. In each of test samples, 10 AlN particles were subjected to the element analysis, and, the average in Mg content of the ten AlN particles was determined. The data of the content of Mg in the AlN particle in each sample is shown in Table 2.

The presence of composite oxide containing a rare earth element and Al and composite oxynitride containing Mg and Al, and their forms were examined by observation of the fracture surface of the section of the AlN-based sintered compact under SEM. To determine the presence of composite oxide particles and composite oxynitride particles, element analysis for other phase than AlN and the checking of aspect length-to-width ratio were conducted. Referring to Table 2, the sample rated as "Good" is one in which the area of composite oxide and composite oxynitride in particulate form accounts for 30% or greater of the total area of composite oxide and composite oxynitride observed in the section of the AlN-based sintered compact, whereas the sample rated as "Poor" is one in which the observed composite oxide and composite oxynitride exist in the form of a continuous grain boundary layer covering the AlN particle. Note that the composite oxide and composite oxynitride judged as particles have an aspect length-to-width ratio of 5 or less, wherein the length corresponds to the maximum length in section and the width corresponds to the minimum length in section.

The crystal structure of composite oxide containing a rare earth element and Al has been examined by X-ray diffraction (XRD) measurement of the AlN-based sintered compact. Identification of compounds containing Mg and Al was made by examining the section structure of the AlN-based sintered compact through local element analysis, and the result is shown in Table 2. Considering the possibility of coincidence in XRD peak between $MgAl_2O_4$ crystal and MgAlON crystal, a particle or grain boundary phase in which Mg, Al, and O were detected by the local element analysis was defined as $MgAl_2O_4$, and, a particle or grain boundary phase in which Mg, Al, O, and N were analytically detected was defined as MgAlON.

The volume resistivity of the AlN-based sintered compact was measured in conformance with JIS 2141. The data of the volume resistivity of each sample at 700° C. is shown in Table 2. The thermal conductivity of the AlN-based sintered compact was measured by the laser flash method. The result of measurement is shown in Table 2.

The AlN-based sintered compact has been evaluated for plasma resistance with use of a plasma reactor. As fluorine gas, a $CF_4$—$CHF_3$—Ar gas mixture of 20% by volume of $CF_4$, 40% by volume of $CHF_3$, and 40% by volume of Ar was used. The AlN-based sintered compact including a mirror-finished surface was placed inside the chamber of the plasma reactor, and the gas mixture was introduced into the chamber. With the pressure inside the chamber maintained at 10 Pa, high-frequency plasma was generated under electric power set at 0.8 W/cm$^2$, and the AlN-based sintered compact was etched for 2 hours. The data of plasma resistance in each sample, expressed in terms of etching rate (μm/h), is shown in Table 2.

TABLE 1

| | Additives*[1] | | Firing conditions | | | |
|---|---|---|---|---|---|---|
| | Rare earth oxide | Magnesium hydroxide | Rate of temperature rise | Maximum temperature | Retention time | Cooling rate |
| Sample No. | Type | mol % | mol % | ° C./min | ° C. | Hr | ° C./min |
| 1 | Sm | 0.3 | 1.0 | 1 | 1850 | 5 | 3 |
| 2 | Dy | 0.3 | 1.0 | 1 | 1850 | 5 | 3 |
| 3 | Er | 0.3 | 1.0 | 1 | 1850 | 5 | 3 |
| 4 | Lu | 0.3 | 1.0 | 1 | 1850 | 5 | 3 |
| 5 | Y | 0.08 | 1.0 | 1 | 1850 | 5 | 3 |
| 6 | Y | 0.15 | 1.0 | 1 | 1850 | 5 | 3 |
| 7 | Y | 0.3 | 1.0 | 1 | 1850 | 5 | 3 |
| 8 | Y | 0.45 | 1.0 | 1 | 1850 | 5 | 3 |
| 9 | Y | 0.55 | 1.0 | 1 | 1850 | 5 | 3 |
| 10 | Y | 0.8 | 1.0 | 1 | 1850 | 5 | 3 |
| 11 | Y | 1.0 | 1.0 | 1 | 1850 | 5 | 3 |
| 12 | Y | 1.2 | 1.0 | 1 | 1850 | 5 | 3 |
| 13 | Y | 0.3 | 0.05 | 1 | 1850 | 5 | 3 |
| 14 | Y | 0.3 | 0.3 | 1 | 1850 | 5 | 3 |
| 15 | Y | 0.3 | 0.5 | 1 | 1850 | 5 | 3 |
| 16 | Y | 0.3 | 1.2 | 1 | 1850 | 5 | 3 |
| 17 | Y | 0.3 | 1.7 | 1 | 1850 | 5 | 3 |
| 18 | Y | 0.3 | 2.5 | 1 | 1850 | 5 | 5 |
| 19 | Y | 0.3 | 3.0 | 1 | 1850 | 5 | 5 |
| 20 | Y | 0.3 | 4.0 | 1 | 1850 | 5 | 5 |
| 21 | Y | 0.3 | 1.0 | 0.3 | 1850 | 5 | 3 |
| 22 | Y | 0.3 | 1.0 | 3 | 1850 | 5 | 3 |
| 23 | Y | 0.3 | 1.0 | 10 | 1850 | 5 | 3 |
| 24 | Y | 0.3 | 1.0 | 1 | 1650 | 10 | 3 |
| 25 | Y | 0.3 | 1.0 | 1 | 1700 | 10 | 3 |
| 26 | Y | 0.3 | 1.0 | 1 | 1800 | 10 | 3 |
| 27 | Y | 0.3 | 1.0 | 1 | 1900 | 5 | 3 |
| 28 | Y | 0.3 | 1.0 | 1 | 1850 | 5 | 0.3 |
| 29 | Y | 0.3 | 1.0 | 1 | 1850 | 5 | 1 |
| 30 | Y | 0.3 | 1.0 | 1 | 1850 | 5 | 8 |

*[1]Mol percentage of added $R_2O_3$ (or MgO)-equivalent compound based on 100 mol % of AlN (wherein R represents rare earth element).

TABLE 2

| | AlN-based sintered compact | | | | | | | |
|---|---|---|---|---|---|---|---|---|
| | | | Other compounds than AlN | | | Characteristics | | |
| | | | Rare earth | | Grain boundary | | | |
| Sample No. | Open porosity % | Mg content in AlN particle mol % | element- containing compound | Mg- containing compound | phase structure *[2] | Resistivity at 700° C. Ω · m | Thermal conductivity W/mK | Etching rate μm/h |
| 1 | <0.1 | 0.4 | $Sm_3Al_5O_{12}$ | MgAlON | Good | $2.5 \times 10^7$ | 124 | 3.57 |
| 2 | <0.1 | 0.4 | $Dy_3Al_5O_{12}$ | MgAlON | Good | $1.3 \times 10^7$ | 128 | 3.23 |
| 3 | <0.1 | 0.4 | $Er_3Al_5O_{12}$ | MgAlON | Good | $1.7 \times 10^7$ | 125 | 3.59 |

TABLE 2-continued

AlN-based sintered compact

| | | | Other compounds than AlN | | | Characteristics | | |
|---|---|---|---|---|---|---|---|---|
| | | | Rare earth | | Grain boundary | | | |
| Sample No. | Open porosity % | Mg content in AlN particle mol % | element-containing compound | Mg-containing compound | phase structure *2 — | Resistivity at 700° C. Ω·m | Thermal conductivity W/mK | Etching rate μm/h |
| 4 | <0.1 | 0.4 | $Lu_3Al_5O_{12}$ | MgAlON | Good | $3.3 \times 10^7$ | 133 | 2.87 |
| 5 | <0.1 | 0.4 | $Y_3Al_5O_{12}$ | MgAlON | Good | $2.7 \times 10^7$ | 121 | 3.22 |
| 6 | <0.1 | 0.4 | $Y_3Al_5O_{12}$ | MgAlON | Good | $3.1 \times 10^7$ | 125 | 3.07 |
| 7 | <0.1 | 0.4 | $Y_3Al_5O_{12}$ | MgAlON | Good | $5.5 \times 10^7$ | 136 | 2.91 |
| 8 | <0.1 | 0.4 | $Y_3Al_5O_{12}$ | MgAlON | Good | $1.9 \times 10^7$ | 147 | 2.64 |
| 9 | <0.1 | 0.4 | $Y_3Al_5O_{12}$ $YAlO_3$ | MgAlON | Good | $1.0 \times 10^7$ | 153 | 2.45 |
| 10 | <0.1 | 0.4 | $Y_3Al_5O_{12}$ $YAlO_3$ | MgAlON | Good | $8.7 \times 10^6$ | 162 | 2.41 |
| 11 | <0.1 | 0.4 | $Y_3Al_5O_{12}$ $YAlO_3$ | MgAlON | Good | $6.5 \times 10^6$ | 177 | 2.35 |
| 12 | <0.1 | 0.4 | $Y_3Al_5O_{12}$ $YAlO_3$ | MgAlON | Good | $6.1 \times 10^6$ | 185 | 2.33 |
| 13 | <0.1 | <0.1 | $Y_3Al_5O_{12}$ $YAlO_3$ | — | Good | $4.3 \times 10^5$ | 166 | 3.15 |
| 14 | <0.1 | 0.1 | $Y_3Al_5O_{12}$ | MgAlON | Good | $1.3 \times 10^7$ | 144 | 2.63 |
| 15 | <0.1 | 0.2 | $Y_3Al_5O_{12}$ | MgAlON | Good | $2.6 \times 10^8$ | 142 | 2.80 |
| 16 | <0.1 | 0.4 | $Y_3Al_5O_{12}$ | MgAlON | Good | $5.9 \times 10^7$ | 131 | 3.02 |
| 17 | <0.1 | 0.6 | $Y_3Al_5O_{12}$ | MgAlON | Good | $7.2 \times 10^7$ | 123 | 3.37 |
| 18 | <0.1 | 0.9 | $Y_3Al_5O_{12}$ | MgAlON | Good | $7.8 \times 10^7$ | 121 | 3.52 |
| 19 | <0.1 | 1.1 | $Y_3Al_5O_{12}$ | MgAlON | Good | $3.4 \times 10^7$ | 120 | 3.61 |
| 20 | <0.1 | 1.2 | $Y_3Al_5O_{12}$ | MgAlON | Good | $4.2 \times 10^7$ | 120 | 3.77 |
| 21 | 0.15 | 0.4 | $Y_3Al_5O_{12}$ | MgAlON | Good | $3.8 \times 10^7$ | 124 | 3.76 |
| 22 | <0.1 | 0.4 | $Y_3Al_5O_{12}$ | MgAlON | Good | $1.2 \times 10^7$ | 137 | 2.58 |
| 23 | <0.1 | <0.1 | $Y_3Al_5O_{12}$ | MgAlON $MgAl_2O_4$ | Good | $6.1 \times 10^6$ | 140 | 4.45 |
| 24 | 0.31 | <0.1 | $Y_3Al_5O_{12}$ | MgAlON | Good | $3.5 \times 10^6$ | 103 | 4.67 |
| 25 | <0.1 | 0.2 | $Y_3Al_5O_{12}$ | MgAlON | Good | $2.7 \times 10^7$ | 122 | 3.43 |
| 26 | <0.1 | 0.3 | $Y_3Al_5O_{12}$ | MgAlON | Good | $3.3 \times 10^7$ | 128 | 2.98 |
| 27 | <0.1 | 0.7 | $Y_3Al_5O_{12}$ | MgAlON | Good | $4.6 \times 10^7$ | 135 | 3.11 |
| 28 | 0.16 | 0.6 | $Y_3Al_5O_{12}$ | MgAlON | Good | $5.4 \times 10^7$ | 121 | 3.83 |
| 29 | <0.1 | 0.5 | $Y_3Al_5O_{12}$ | MgAlON | Good | $1.5 \times 10^7$ | 127 | 2.86 |
| 30 | <0.1 | 0.4 | $Y_3Al_5O_{12}$ | MgAlON | Poor | $5.6 \times 10^5$ | 116 | 2.92 |

*2 "Good": Area proportion of composite oxide and composite oxynitride in particulate form with aspect ratio of less than or equal to 5 is greater than or equal to 30%; and "Poor": Composite oxide and composite oxynitride exist as continuous grain boundary layer covering AlN particle.

Sample No. 30 bearing AlN particle-covering continuous grain boundary layers and Sample Nos. 13, 23, and 24 free of Mg in solid solution in AlN particles were found to be low in respect of one of volume resistivity, thermal conductivity, and plasma resistance. On the other hand, Sample Nos. 1 through 12, 14 through 22, and 25 through 29, each including AlN particles with Mg present in solid solution therein, composite oxide particles containing a rare earth element and Al constituting a garnet crystal structure, and composite oxynitride particles containing Mg and Al, were found to have excellent characteristics, that is; they exhibit volume resistivity of greater than $1 \times 10^6$ Ω·m at 700° C., and also exhibit thermal conductivity of greater than or equal to 120 W/mK. These samples were also found to exhibit high resistance to corrosion by halogen gas plasma. In particular, Sample Nos. 1 through 8, 14 through 22, and 25 through 29, each including composite oxide particles containing a rare earth element and Al that constitute a garnet crystal structure, were found to exhibit high volume resistivity of $1.2 \times 10^7$ Ω·m or greater at 700° C.

REFERENCE SIGNS LIST

1: Aluminum nitride-based sintered compact
2: Aluminum nitride crystal particles
3: Particles of composite oxide containing rare earth element and Al
4: Particles of composite oxynitride containing Mg and Al
11: Electrostatic chuck
12: Base
13: Electrostatic adsorptive electrode
14: Dielectric layer
15: Object to be held
16: Attractive face
17: Feeding terminal
18: Joining material

The invention claimed is:
1. An aluminum nitride-based sintered compact, comprising:
aluminum nitride crystal particles comprising Mg;
composite oxide comprising a rare earth element and Al, the composite oxide having a garnet crystal structure; and
composite oxynitride comprising Mg and Al,
the composite oxide and the composite oxynitride being interspersed as particles between the aluminum nitride crystal particles.
2. The aluminum nitride-based sintered compact according to claim 1,
wherein the composite oxide comprises Y.
3. The aluminum nitride-based sintered compact according to claim 1,
wherein a content of Mg in the aluminum nitride crystal particles falls in a range of 0.1 mol % or more and 1.0 mol % or less, based on a total of all metal elements contained in the aluminum nitride crystal particles taken as 100 mol %.

4. A semiconductor holding device, comprising:
the aluminum nitride-based sintered compact according to claim 1; and
an electrostatic adsorptive electrode.

\* \* \* \* \*